United States Patent [19]

Kroko

[11] Patent Number: 4,786,166
[45] Date of Patent: Nov. 22, 1988

[54] DETERMINATION OF FOCAL PLANE FOR A SCANNING PROJECTION ALIGNER

[75] Inventor: Catherine G. Kroko, Corvallis, Oreg.

[73] Assignee: Hewlett-Packard Company, Palo Alto, Calif.

[21] Appl. No.: 56,192

[22] Filed: Jun. 1, 1987

[51] Int. Cl.$^4$ .............................................. G01B 9/00
[52] U.S. Cl. .................................................. 356/123
[58] Field of Search ............... 356/123, 124, 124.5, 356/125, 126, 127

[56] References Cited

PUBLICATIONS

*IBM Technical Disclosure Bulletin,* vol. 29, No. 2, Jul. 1986, pp. 681 and 682.

Primary Examiner—F. L. Evans
Attorney, Agent, or Firm—S. A. Kassatly; Bloor Redding, Jr.

[57] ABSTRACT

An improved pattern of lines (26, 28) is placed on a wedged substrate (18) used to locate the focal plane of a scanning projection aligner. This pattern replaces the conventional array of microscopic resolution targets with large regions of microscopic lines and spaces. When printed, in- and out-of-focus conditions are macroscopically apparent due to the presence or absence of photoresist (14). Desired quantities conventionally determined from microscopic data, such as location of the best focus plane, astigmatism, mask-to-wafer parallelism, mirror aberrations and misalignments, are macroscopically determined in accordance with the invention.

10 Claims, 1 Drawing Sheet

DETERMINATION OF FOCAL PLANE FOR A SCANNING PROJECTION ALIGNER

TECHNICAL FIELD

The present invention relates to scanning projection aligners, commonly used in processing wafers to fabricate integrated circuits thereon, and, more particularly, involves the measurement of the location of the plane of best focus of the projected image, which is employed in preparing an aligner for exposing a pattern in resist films on wafers for semiconductor device fabrication.

BACKGROUND ART

A scanning projection aligner typically comprises in order: a light source, a condenser, and a series of mirrors or lenses through which the image is projected until it reaches the wafer. The term "scanning" refers to the fact that the mask containing the master image and the wafer coated with photoresist are mounted on a moving carriage that is scanned past the stationary intense arc of light and the mirror or lens system. In this way, portions of the photoresist are exposed with the mask pattern, a section at a time. A subsequent development process removes some of the resist, leaving the pattern. Either the exposed portions or the unexposed portions are removed, depending on whether the resist is a positive or a negative resist, respectively.

The mask and wafer are typically about 9 inches apart, physically. However, mirrors are used to divert the light from the direct distance to a path several feet long. The image of the mask must be in focus at the plane of the photoresist in order that the image can be faithfully replicated in the resist. If the image is not in focus, the illumination will be spread out and cause loss of sharpness and critical dimension control in the resist image. To ensure that the image will be in focus at the resist, the location of the focal plane of the aligner must be routinely measured to qualify the aligner for use.

Several problems may cause the focal plane to be in the wrong place. Displacement on the order of micrometers may be enough to interfere with the success of fine line lighography. For example, if either the wafer or the mask are not perpendicular to the optical axis of the system, then they will not be parallel to each other. This will lead to a difference in optical path length between corresponding sections of mask and wafer at different parts of the wafer. The result will be that in some areas, the image may be in focus, and at others, it will be out of focus. Position misadjustment or contamination build-up on the mask (pattern side) contact plane or wafer (front side) contact plane may cause this.

The optical path length through the optics is also important. The position of mirror or lens elements may be sensitive to heating effects, mechanical adjustment, and drift due to the nature of their mounting. This can move the plane of best focus away from its target location at the resist.

Optics problems caused by misalignment of one element to another or of the illumination arc to the optics may cause an astigmatic result in some locations, in which sagittal and tangential lines are not simultaneously in focus. Finally, aberrations on mirrors or lenses may cause the focal plane location to vary.

Such problems can be detected by intentionally varying the optical path length between the mask and the wafer to locate the center of focus. Due to the nature of the mirror or lens element mounting, and the hysteresis and drift associated with any intentional focus adjustments, it is not desirable to print resolution patterns at different nominal focus settings, as is typically done on a step-and-repeat projection aligner. Rather, a special mask including a wedged, patterned section is used. The wedge places the repeated target pattern at a range of known different path lengths from the wafer.

The conventional pattern comprises a set of microscopic resolution targets that are repeated in several rows across the wedge. When the pattern is imaged onto the wafer, the resolution bars will be printed in varying degrees of focus. After the wafer is developed, the patterns are inspected through a microscope and their relative resolution is recorded by position. A poorly focused image will print resolution targets with poor dimensional control, shallow resist sidewall slopes, and resist bridging between features. A well-focused image will result in a sharp pattern for which separate mask features are distinct. The center of the best resolved patterns is at best focus and so defines the optimum optical path length. From the position of that center, the deviation from the nominal plane due to the wedge is known. In this way, best focus offsets of sagittal and tangential (or vertical and horizontal) lines at several positions along the illumination arc are determined and plotted. The relative positions of the centers of focus can form patterns characteristic of the various problems discussed above.

In practice, a mask with the center chrome patterned region offset in a plane that intersects the plane of the edges of the mask that contact the aligner's mask reference plane is used. The wedged area is mostly chrome, with microscopic resolution targets repeated in, for example, three or five rows across the mask.

The areas between the rows are not tested because of the amount of inspection that would be required. Focus in intermediate areas is assumed to be no worse than in measured locations, and most adjustable problems can be detected from first order characteristics.

When a wafer is exposed with the pattern, only those targets within the depth of focus of the resist/aligner system will be resolved in the resist. Any targets closer to, or further away from, the wafer than that will be out of focus and thus will not resolve in the resist. If a scanning aligner is correctly adjusted and the mirrors or lenses are relatively free of aberrations, then the center of focus for sagittal and tangential lines will be near the center of the mask targets. At the center, the wedge is at the same depth as the edges of the mask. The amount of deviation from the optimum focus plane can be determined knowing which targets did print in good focus and where they were on the wedge.

To interrupt the data from the conventional focus wedge wafer, approximately 100 sets of resolution bars are inspected microscopically by the operator. Resolved targets are counted from the center of the wafer. Positions with resolved targets are denoted on the data sheet by entering one type of mark, such as a plus or slash. Positions not meeting the criteria of resolution are marked with another type of mark, such as a "0". On the data sheet, the center of the resolved targets for each row and orientation is then chosen and compared with specification limits and with positions of other centers. Focus, astigmatism, parallelism, and various mirror/lens aberrations and misalignments are detected with this test.

To expose and develop a wafer in this manner will require about 5 to 10 minutes, depending on the type of equipment. An additional 4 minutes (approximately) is needed to read and record the data and to interpret and compare the data to specification limits.

A number of possible cleanings and adjustments can be performed by qualified technical people to return a machine to the desired state, where the plane of best focus is at the plane of the resist. After any adjustment, the focus wedge test is repeated to verify the correction. This can be time consuming and requires additional checking later due to the possibility of post adjustment drift.

A need remains for measuring the location of the focal plane of a scanning projection aligner across a larger area, and in a more rapid manner.

DISCLOSURE OF INVENTION

In accordance with the invention, a method of measuring the location of the plane of best focus is provided. The method involves the use of a mask with a wedged patterned surface, as is conventional, but the microscopic pattern is replaced with one that can be interpreted macroscopically.

The new pattern comprises a series of lines and spaces whose size is near the resolution limit of the aligner/resist system. Such patterns have been demonstrated to give a dramatic illustration of the condition of best focus on step-and-repeat projection aligners when exposed at different focus/exposure conditions.

The line/space pattern is broken into stripes that traverse the wedge, each wide enough to be viewed and interpreted macroscopically when imaged on the test wafer. Stripes would alternate between sagittal and tangential (or vertical and horizontal) lines.

After a focus test wafer is spun, exposed and developed, best focus for the orientation of the features printed is at the center of that section of the stripe on which a pattern is visible. Best focus is determined by the presence or absence of resist pattern on portions of the wafer, not by measurement or by some subjective assessment of "resolution".

The method of the invention is seen to exploit focus as a parameter which causes macroscopically visible, highly constrasted profiles. The governing concept is that only those sections of the wedge pattern whose nominal plane of best focus is at the resist will actually print resolved lines and spaces. Closer in and further out sections of the wedge will project an image with insufficient contrast at the resist to resolve. The illumination energy will thus be spread out through the resist so that the resist will be washed away in development.

The amount of time required to expose and develop the wafer employing the procedure of the invention is about the same as that of the prior art procedure. However, the microscopic reading and recording step of the prior art procedure is eliminated. Further, considerable time savings will be realized when the machine is out of specification and several tests are require to confirm the problem and to check adjustments. Finally, since use of a microscope is eliminated, the procedure of the invention avoids equipment needs and operator fatigue associated with microscopic evaluation.

BEST MODES FOR CARRYING OUT THE INVENTION

Figure 1:
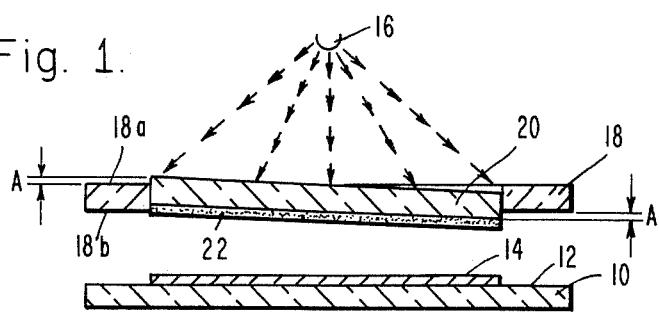
FIG. 1 is a diagrammatic, cross-sectional view showing a projection aligner light source, a mask having a wedged, patterned section, and a wafer provided with a coating of a photoresist.

Referring now to the drawing wherein like numerals of reference designate like characters throughout, a wafer 10 is depicted, a major surface 12 of which is at least partially coated with a coating 14 comprising a saturable photosensitive medium, or photoresist. The wafer is placed in a scanning projection aligner (not shown), provided with a means of illumination 16 and various mirrors/lenses (not shown) common in the art. Between the source of illumination 16 with its attendant mirrors/lenses is placed a wedged mask 18, in the center region of which is formed a wedge portion 20 provided with a pattern of lines 22.

For the sake of clarity, the thicknesses of the coatings 14, 22 and the extent of the wedge slope are greatly exaggerated. In practice, the wedge typically extends about 50 μm above the upper surface 18a on one side of the mask 18 and an equal amount below the lower surface 18bp on the opposite side thereof, as shown at the arrow sets denoted "A".

Figure 2:
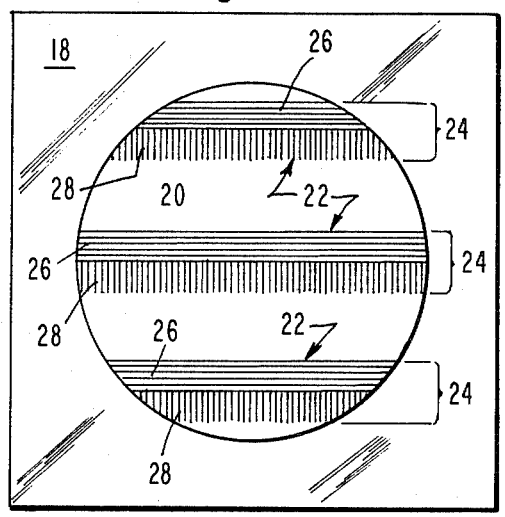
FIG. 2 is a plan view of the mask of FIG. 1, showing a microscopic pattern of horizontal and vertical lines arranged in a series of stripes across the wedge.

A pattern 22 which is preferably used comprises wide alternating stripes 24 of horizontal 26 and vertical 28 lines in place of microscopic targets, as shown in FIG. 2. The pattern 22 comprises a material opaque to the illuminating wavelength, usually chrome or anti-reflective chrome. Such materials are well-known in the art.

The arrangement of the stripes may comprise either alternating horizontal and vertical lines or alternating sagittal (radial) and tangential lines. These sets of terms are not exactly equivalent, and depend on where one is on the lens. Essentially, the alternating sets of lines are perpendicular to adjacent sets of lines.

The opaque material is formed to a thickness of about 800 to 1,300 Å, having line widths and spaces slightly larger than the minimum resolvable feature of the resist-/aligner system. The formation of such material is conveniently accomplished by sputtering a thin layer thereof on the wedged substrate, patterning the material with resist and electron beam or optical radiation, and then etching to define the pattern.

Preferably, the line and space widths may range from about 1 to 25% above the resolution limit of the resist aligner system. The lines and spaces are sized so as to provide lines on the wafer 10 of about 2 μm and spaces of about 2 μm. However, depending upon the resolution capability of the aligner, as the technology advances and smaller line widths and spaces can be printed, smaller line widths and spaces may be employed.

Figure 3:
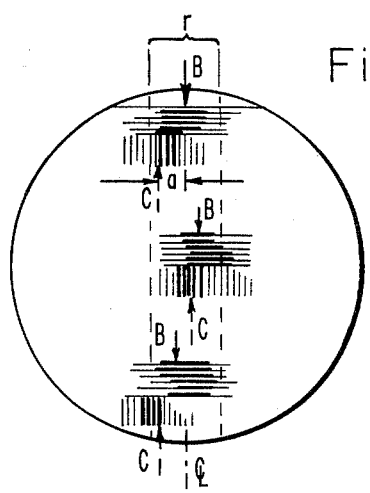
FIG. 3 is a plan view of the resist-coated wafer, following exposure and development, showing the regions of photoresist remaining and the determination of center of focus for each location.

After developing a resist-coated wafer exposed on a scanning projection aligner, the location of best focus for the various arc locations and line orientations is macroscopically apparent, as shown in FIG. 3. Regions within the depth of focus are in focus, so the resist pattern is resolved and distinct. The pattern in regions increasingly far from the center of focus fades away. This is because a poorly focused image has low contrast at the resist, so all the resist is somewhat exposed and much is subsequently washed off in the developer used in the development process. The center of focus for each location and orientation is at the center of the region in which resist remains. Thus, the center of focus for each row 24 of lines 26, 28 can be chosen macroscopically. This eliminates the need for microscopic determination, and improves the accuracy of the determination because the larger area is less sensiive to local process variations.

The centers of focus, as in the conventional method, described above, are compared with a specification and with each other to qualify the machine. For example, the daily qualification test has been found to be required on an aligner only once per 24 hour period. After weekend or other shutdown, the aligner must be qualified before it can be used. If a machine fails to meet the specifications for this test, corrective action is taken and the test repeated. Thus, it will be appreciated that the time savings and reduced complexity of testing with the method of the invention can be substantial. For example, if three tests are required, the savings in time could be on the order of 10 minutes over the prior art procedure.

The wafer 10 is spun with photoresist 14 typical of the process used in manufacturing. Alternatively, a thinner resist could be used to characterize a machine for use with a thicker resist, so long as the offset between the indicated focus conditions is known. The thickness of the photoresist 14 is typically on the order of about 8,000 to 12,000 Å.

The terms "photoresist" and "resist" are used interchangeably herein, and denote a material which is sensitive to radiation, whether optical or at other wavelengths, utilized to expose portions of such material on a semiconductor wafer in processes for forming devices and circuits therein.

The wafer 10 is exposed at a nominally constant exposure scan speed using the wedged reticle 18 described, then developed. The wafer 10 is examined without the aid of a microscope. The location of the centers of the patterned regions of each stripe is determined and compared with the specification limits for each and with the positions of the centers of other stripes.

For example, as shown in FIG. 3, the arrows designated "B" denote the center of focus of the horizontal lines 26, while the arrows designated "C" denote the center of focus of the vertical lines 28.

The wafer shown in FIG. 3 evidences some astigmatism and curvature. The length of portion "a" (the distance of the actual center of focus "C" from the desired location of centers of focus "CL") is part of the specification criteria. The range "r" is the acceptable specification range for focus centers. Here, the centers of focus are all within the desired specification. In addition, the maximum allowable distance between associated horizontal and vertical centers is also specified separately to limit astigmatism in printed images.

A range of line/space widths might be used all on one reticle to ensure that one would work with any variety of processes or resist thicknesses. Since it is the position of the center of the resolved patterns that is significant, the width of the apparent patterned region of the stripe on the wafer, which would depend on a number of variables, such as the linewidth on the mask, exposure value, and photoresist parameters, can be allowed to vary without causing any difference in the location of the center.

The stripes could be partitioned into a string of boxes containing the line/spaces to give a measurement "ruler". Identifying labels for position or line orientation could be added to the pattern.

Alternatively, a "plaid" pattern formed by overlaying two sets of linespaces perpendicularly could be used, but some information regarding the performance of horizontal versus vertical lines may be lost.

The stripes of lines could be made to cover the entire wedge, rather than the three to five rows, as is conventional. As data is so easy to collect with the method of the invention, there is no reason to limit the data to a number of rows that is reasonable for a microscopic method. The benefit of this is that the whole exposure field can now be characterized for focus. This makes the mask a valuable engineering tool for, perhaps, investigating any focus problems, characterizing a machine quickly at a vendor's factory before purchase, or selecting the best machine from a group for a critical patterning level.

Due to the macroscopic nature of the pattern produced on the wafer, the method of the invention yields the following benefits:
(1) no microscope is necessary;
(2) determination of center of focus is faster than the prior art method;
(3) complexity of the focus test is reduced, making it easier to train operators and verify results;
(4) logging and paper requirements are decreased, and history can be logged simply by photocopying whole wafers, if desired;
(5) maintenance down-time following adjustment for failed focus test is decreased;
(6) engineering characterization and investigation are enhanced; and
(7) increased accuracy is possible due to increased area of evaluation and decreased operator fatigue.

In addition to the above-described applications for daily focus qualification, other diagnostic characterization tasks are made possible or practical and qualifying tasks are streamlined with the approach of the invention.

Full mirror imaging portion test. At present, only three to five spots of the optical system are tested. Due to the ease of evaluation, the complete imaging section of the mirrors can be tested simply by covering the wedge with lines throughout.

Poor focus. Testing of any treatment or conditions is so quick and simple that focus problems can be easily studied.

Critical dimensions (CDs). Process CDs using the analagous mask on a step-and-repeat projection aligner may be monitored employing the macroscopic pattern. This approach may also be possible for a scanning aligner process. Alternatively, it might be possible that if mask CDs and resist parameters could be controlled tightly enough, then an exposure test could be used to verify exposure dose and dose uniformity, thereby reducing the need for aligner daily exposure dose calibration.

INDUSTRIAL APPLICABILITY

The macroscopic method of the invention is useful in determining the focal plane for a scanning projection aligner. The method is expected to find use in qualifying such aligners for use in processing semiconductor devices on wafers, employing patterned photoresist layers formed by means of patterned masks.

Thus, there has been disclosed a macroscopic method for determination of focal plane for a scanning projection aligner. It will be apparent to those or ordinary skill in the art that various changes and modifications of an obvious nature may be made. All such changes and modifications are considered to fall within the scope of the invention as defined by the appended claims.

What is claimed is:

1. A method of determining the location of the best focus surface of a scanning projection resist/aligner system having minimum resolvable features, comprising:
   (a) exposing an image in a resist layer formed on a polished side of a wafer through a wedged mask patterned with a plurality of opaque lines and clear spaces of widths nearly the size of the minimum resolvable features of the resist/aligner system;
   (b) developing the resist; and
   (c) determining the location of the best focus "plane" or surface by selecting the center of the resulting patterns.

2. The method of claim 1 wherein said center of said resulting pattern is displaced by a known amount by said wedged mask, thus defining said location of said surface of best focus.

3. A mask pattern arrangement to be placed on a conventional wedged mask substrate for use in a scanning projection aligner having minimum resolvable features and a condenser/optics system, which when patterned in a resist layer on a wafer, allows quick macroscopic evaluation of the optical condition of the aligner, the mask pattern comprising:
   (a) a plurality of opaque lines and clear spaces of width nearly the size of the minimum resolvable feature of the aligner; and
   (b) wherein the pattern is arranged in stripes across the wedged mask so that each stripe will provide information about one segment of the aligner condenser/optics system.

4. The arrangement of claim 3 wherein said stripes contain either (a) alternating sets of sagittal and tangential lines and spaces or (b) alternating sets of horizontal and vertical lines and spaces.

5. The arrangement of claim 3 wherein said stripes are partitioned or otherwise divided to provide a scale for measurement.

6. The arrangement of claim 3 wherein said location of the centers of the resulting patterns, when compared to each other and to a specified range form characteristic patterns belying specific machine problems.

7. The arrangement of claim 3 wherein said lines and spaces vary from about 1 to 25% above the minimum resolvable feature of the aligner/resist system.

8. The arrangement of claim 3 wherein said opaque lines on the mask comprise chrome or anti-reflective chrome.

9. The arrangement of claim 3 wherein the wafer is completely covered with stripes of lines and spaces so that the entire mirror or lens portions employed in printing can be characterized with respect to problems resulting from focus, astigmatism, system misalignments, aberrations and mechanical alignment of all relevant surfaces without the aid of a microscope.

10. A method of diagnosing and characterizing a lens in a scanning projection aligner comprising (a) forming a plurality of stripes of resist on a polished side of a flat wafer, said stripes comprising alternating strips of sagittal and tangential lines or horizontal and vertical lines formed by exposure through a similarly-patterned wedges mask; (b) developing the resist to macroscopically define a region in each stripe at best focus, (c) determining the centers of each said region; and (d) comparing the location of said centers with a predetermined specification for each stripe and with the location of centers of other stripes.

* * * * *